(12) United States Patent
Guillorn et al.

(10) Patent No.: US 11,075,265 B2
(45) Date of Patent: Jul. 27, 2021

(54) TRIGATE DEVICE WITH FULL SILICIDED EPI-LESS SOURCE/DRAIN FOR HIGH DENSITY ACCESS TRANSISTOR APPLICATIONS

(71) Applicant: INTERNATIONAL BUSINESS MACHINES CORPORATION, Armonk, NY (US)

(72) Inventors: Michael A. Guillorn, Cold Springs, NY (US); Fei Liu, Yorktown Heights, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 16/378,031

(22) Filed: Apr. 8, 2019

(65) Prior Publication Data
US 2019/0237538 A1 Aug. 1, 2019

Related U.S. Application Data

(62) Division of application No. 14/839,213, filed on Aug. 28, 2015, now Pat. No. 10,312,321.

(51) Int. Cl.
*H01L 27/108* (2006.01)
*H01L 29/06* (2006.01)
(Continued)

(52) U.S. Cl.
CPC ........ *H01L 29/0638* (2013.01); *H01L 21/265* (2013.01); *H01L 21/283* (2013.01);
(Continued)

(58) Field of Classification Search
CPC .................... H01L 27/10867; H01L 29/41791
See application file for complete search history.

(56) References Cited

U.S. PATENT DOCUMENTS 6,353,269 B1   3/2002   Huang
7,682,971 B2   3/2010   Oh
(Continued)

FOREIGN PATENT DOCUMENTS

KR   10-2010-0080161 A   7/2010
WO   2007/109658 A2   9/2007

OTHER PUBLICATIONS

List of IBM Patents or Patent Applications Treated as Related dated Apr. 8, 2019, 2 pages.

*Primary Examiner* — Moazzam Hossain
*Assistant Examiner* — Hajar Kolahdouzan
(74) *Attorney, Agent, or Firm* — Scully, Scott, Murphy & Presser, P.C.; L. Jeffrey Kelly, Esq.

(57) ABSTRACT

After forming a laterally contacting pair of a semiconductor fin and a conductive strap structure overlying a deep trench capacitor embedded in a substrate and forming a gate stack straddling a body region of the semiconductor fin, source/drain regions are formed in portions the semiconductor fin located on opposite sides of the gate stack by ion implantation. Next, a metal layer is applied over the source/drain region and subsequent annealing consumes entire source/drain regions to provide fully alloyed source/drain regions. A post alloyzation ion implantation is then performed to introduce dopants into the fully alloyed source/drain regions followed by an anneal to segregate the implanted dopants at interfaces between the fully alloyed source/drain regions and the body region of the semiconductor fin.

19 Claims, 10 Drawing Sheets

(51) Int. Cl.
*H01L 49/02* (2006.01)
*H01L 23/528* (2006.01)
*H01L 29/417* (2006.01)
*H01L 29/66* (2006.01)
*H01L 21/768* (2006.01)
*H01L 21/283* (2006.01)
*H01L 21/265* (2006.01)
*H01L 21/3213* (2006.01)
*H01L 21/324* (2006.01)
*H01L 21/306* (2006.01)
*H01L 29/78* (2006.01)
*H01L 29/45* (2006.01)
*H01L 27/11582* (2017.01)

(52) U.S. Cl.
CPC ...... *H01L 21/30604* (2013.01); *H01L 21/324* (2013.01); *H01L 21/32133* (2013.01); *H01L 21/76895* (2013.01); *H01L 23/528* (2013.01); *H01L 27/11582* (2013.01); *H01L 28/00* (2013.01); *H01L 28/40* (2013.01); *H01L 29/0649* (2013.01); *H01L 29/41791* (2013.01); *H01L 29/45* (2013.01); *H01L 29/66795* (2013.01); *H01L 29/785* (2013.01)

(56) References Cited

U.S. PATENT DOCUMENTS

| | | | |
|---|---|---|---|
| 7,737,015 | B2 | 6/2010 | Kohli et al. |
| 8,492,819 | B2 | 7/2013 | Anderson et al. |
| 8,497,550 | B2 | 7/2013 | Juengling |
| 2008/0206988 | A1 | 8/2008 | Kohli et al. |
| 2009/0256185 | A1* | 10/2009 | Cheng ............... H01L 27/1203 257/301 |
| 2012/0032275 | A1* | 2/2012 | Haran ............... H01L 21/76829 257/401 |
| 2012/0187460 | A1* | 7/2012 | Lavoie ............... H01L 21/02211 257/288 |
| 2012/0299102 | A1 | 11/2012 | Lavoie et al. |
| 2013/0043563 | A1 | 2/2013 | Nakazawa |
| 2013/0248958 | A1 | 9/2013 | Juengling |

* cited by examiner

TRIGATE DEVICE WITH FULL SILICIDED EPI-LESS SOURCE/DRAIN FOR HIGH DENSITY ACCESS TRANSISTOR APPLICATIONS

BACKGROUND

The present application relates to semiconductor devices, and more particularly to fin field effect transistors (FinFETs) having fully alloyed source/drain regions to reduce on-resistance (Ron) in embedded dynamic random access memory (eDRAM) cells.

A memory cell such as an eDRAM cell comprises a storage capacitor formed in a deep trench in a substrate (i.e., deep trench capacitor) for storing electrical charge that characterizes an information content of the memory cell, an access transistor such as a FinFET formed on top of the substrate and adjacent the deep trench capacitor for addressing the storage capacitor, and a conductive strap structure providing an electrical connection between the deep trench capacitor and the FinFET. Many of these embedded memory cells can be arranged on a single chip or within a single package to define an array.

In FinFETs, high conductivity epitaxial raised source/drain regions formed by selective epitaxy have been commonly used to reduce on-resistance (Ron) in order to obtain a high on-current (Ion). Since the conductive strap structure is normally composed of a conductive semiconductor material such as doped polysilicon, and during selective epitaxy in the formation of source/drain regions, the epitaxial growth of a semiconductor material occurs on the surface of the conductive strap structure as well. As the density of eDRAM cells increases, the epitaxial grown semiconductor materiel may merge semiconductor fins of different transistors or may merge an adjacent semiconductor fin and a conductive strap structure, causing unwanted shorts between neighboring transistors and/or neighboring transistors and deep trench capacitors. As such, there remains a need to avoid electrical shorts between neighboring transistors and/or neighboring transistors and deep trench capacitors.

SUMMARY

The present application provides fin-based access transistors with fully alloyed source/drain regions to avoid electrical shorts between neighboring transistors and/or neighboring transistors and deep trench capacitors which are typically encountered when raised source/drain regions are employed in the fin-based access transistors. After forming a laterally contacting pair of a semiconductor fin and a conductive strap structure overlying a deep trench capacitor embedded in a substrate and forming a gate stack straddling a body region of the semiconductor fin, source/drain regions are formed in portions the semiconductor fin located on opposite sides of the gate stack by ion implantation. Next, a metal layer is applied over the source/drain region and subsequent annealing consumes entire source/drain regions to provide fully alloyed source/drain regions. The fully alloyed source/drain regions reduces on-resistance (Ron), thereby increasing on-current (Ion) of the FinFETs. A post alloyzation ion implantation is then performed to introduce dopants into the fully alloyed source/drain regions followed by an anneal to segregate the implanted dopants at interfaces between the fully alloyed source/drain regions and the body region of the semiconductor fin, thereby improving junction performance and reducing off-current (Ioff) of the FinFETs.

In one aspect of the present application, a semiconductor structure is provided. The semiconductor structure includes a deep trench capacitor embedded in a substrate, a conductive strap structure in contact with, and overlying, a topmost surface of the deep trench capacitor. At least a portion of the conductive strap structure is alloyed with a metal. The semiconductor structure further includes an access transistor that includes a semiconductor fin located on the substrate and laterally contacting the conductive strap structure, a gate stack overlying a body region of the semiconductor fin, source/drain regions located in portions of the semiconductor fin laterally surrounding the body region, and a segregated interfacial dopant layer located at an interface between each of the source/drain regions and the body region. The entire source/drain regions are alloyed with the metal.

In another aspect of the present application, a method of forming a semiconductor structure is provided. The method includes first forming a deep trench capacitor in a substrate. The deep trench capacitor includes an inner electrode, a node dielectric, and an outer electrode. A laterally contacting pair of a semiconductor fin and a conductive strap structure is then formed. The conductive strap structure vertically contacts the inner electrode of the deep trench capacitor. After forming a gate stack overlying a body portion of the semiconductor fin, source/drain regions are formed in portion of the semiconductor fin located on opposite sides of the gate stack. The source/drain regions laterally surrounds the body region. Next, fully alloyed source/drain regions and an alloyed conductive strap structure are formed. A segregated interfacial dopant layer is then formed at an interface between each of the fully alloyed source/drain regions and the body region.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1A:
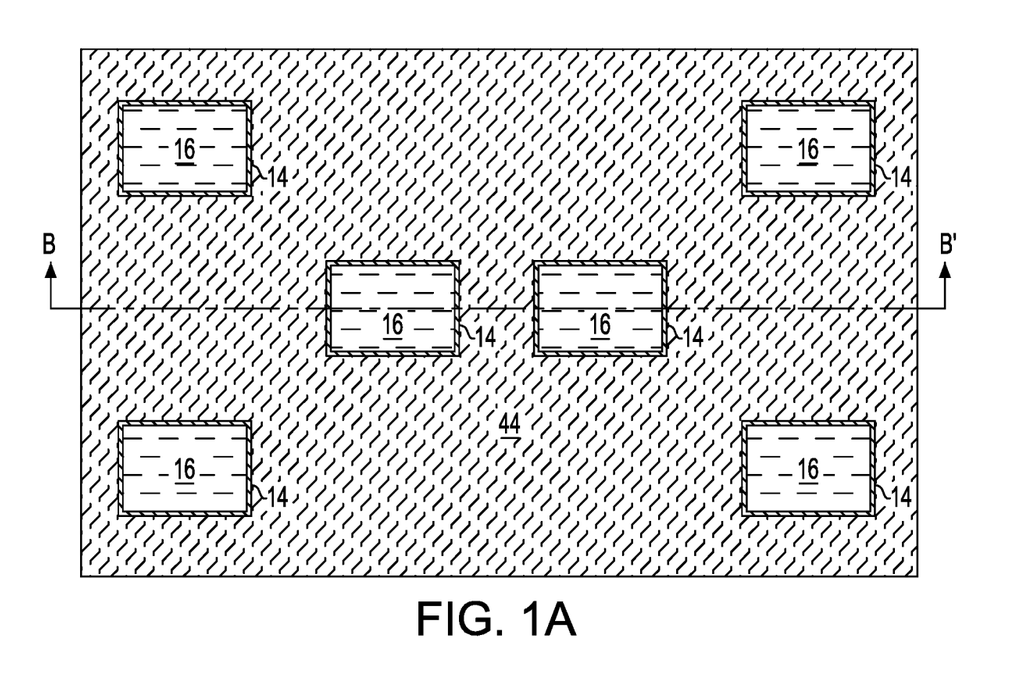
FIG. 1A is a top-down view of an exemplary semiconductor structure after forming deep trench capacitors within a semiconductor-on-insulator (SOI) substrate according to an embodiment of the present application.
Figure 1B:
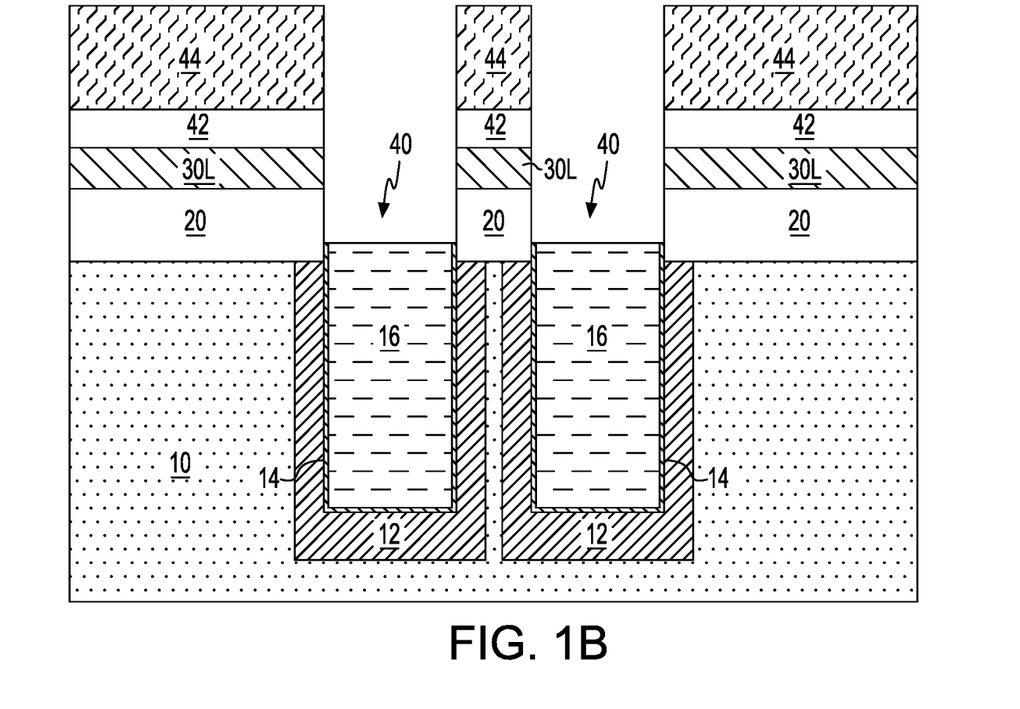
FIG. 1B is a cross-sectional view of the exemplary semiconductor structure of FIG. 1A along the vertical plane B-B'.

Referring to FIGS. 1A and 1B, an exemplary semiconductor structure according to an embodiment of the present application includes a substrate having deep capacitors formed therein. The substrate can be a semiconductor-on-insulator (SOI) substrate or a bulk semiconductor substrate. In one embodiment and as shown in FIG. 1, the substrate is an SOI substrate. While the present application is described for an embodiment in which deep trench capacitors are formed within an SOI substrate, embodiments in which the trench capacitors are formed in a bulk semiconductor substrate are also contemplated herein.

The SOI substrate includes a stack of, from bottom to top, a handle substrate 10, a buried insulator layer 20, and a top semiconductor layer 30L. In some embodiments of the present application, an optional n-doped epitaxial semiconductor layer (not shown) may be present between the handle substrate 10 and the buried insulator layer 20.

The handle substrate 10 may include a semiconductor material, such as, for example, Si, Ge, SiGe, SiC, SiGeC, a compound semiconductor material such as a III-V compound semiconductor material or a II-VI compound semiconductor material, or a combination thereof. In one embodiment, the handle substrate 10 is composed of single crystalline silicon. The thickness of the handle substrate 10 can be from 50 µm to 2 mm, although lesser and greater thicknesses can also be employed.

The buried insulator layer 20 may include a dielectric material such as silicon dioxide, silicon nitride, silicon oxynitride, boron nitride, or a combination thereof. In one embodiment, the buried insulator layer 20 may be formed by a deposition process, such as chemical vapor deposition (CVD) or physically vapor deposition (PVD). In another example, the buried insulator layer 20 may be formed using a thermal growth process, such as thermal oxidation, to convert a surface portion of the handle substrate 10. In yet another embodiment, the buried insulator layer 20 can be formed during a SIMOX process (i.e., Separation by Implantation of Oxygen) in which oxygen ions are implanted into a semiconductor wafer and thereafter an anneal is performed to provide the SOI substrate. The thickness of the buried insulator layer 20 that is formed can be from 50 nm to 200 nm, although lesser or greater thicknesses can also be employed.

The top semiconductor layer 30L may include a semiconductor material, such as, for example, Si, Ge, SiGe, SiC, SiGeC, a compound semiconductor material such as a III-V compound semiconductor material or a II-VI compound semiconductor material, or a combination thereof. The semiconductor materials of the top semiconductor layer 30L and the handle substrate 10 may be the same or different. In one embodiment, the top semiconductor layer 30L includes a single crystalline semiconductor material, such as, for example, single crystalline silicon. The top semiconductor layer 30L may be doped with p-type dopants and/or n-type dopants. Examples of p-type dopants include, but are not limited to, boron, aluminum, gallium and indium. Examples of n-type dopants, include but are not limited to, antimony, arsenic and phosphorous. The top semiconductor layer 30L may be formed by wafer bonding or layer transfer techniques during which a semiconductor layer is transferred from a donor wafer to a receiver wafer containing the handle substrate 10 and the buried insulator layer 20. When a layer transfer process is employed, an optional thinning step may follow the bonding of two semiconductor wafers together. The optional thinning step reduces the thickness of the semiconductor layer to a layer having a thickness that is more desirable. The top semiconductor layer 30L that is formed may have a thickness from 10 nm to 200 nm, although lesser or greater thicknesses can also be employed.

At least one pad layer can be deposited on the SOI substrate (10, 20, 30L), for example, by CVD or atomic layer deposition (ALD). The at least one pad layer can include one or more layers that can be employed as an etch mask for the subsequent formation of the deep trenches in the SOI substrate (10, 20, 30L). As used herein, a "deep trench" refers to a trench that extends from a topmost surface of a SOI substrate through a top semiconductor layer and a buried insulator layer and partly into an underlying semiconductor layer. The pad layer(s) can include a dielectric material and can have a thickness from 100 nm to 2 µm, although lesser and greater thicknesses can also be employed.

In one embodiment, the at least one pad layer can include a vertical stack of, from bottom to top, a pad oxide layer 42 and a pad nitride layer 44. The pad oxide layer 42 may include a dielectric oxide material such as silicon dioxide or a dielectric metal oxide. The pad nitride layer 44 may include a dielectric nitride material such as silicon nitride or a dielectric metal nitride. In one embodiment, the thickness of the pad oxide layer 42 can be from 2 nm to 50 nm, and the thickness of the pad nitride layer 44 can be from 40 nm to 360 nm, although lesser and greater thicknesses can also be employed for each of the pad oxide layer 42 and the pad nitride layer 34.

A photoresist layer (not shown) can be applied over the pad nitride layer 44 and is lithographically patterned to form openings. Each of the openings has an area of a deep trench to be subsequently formed. In one embodiment, the pattern for the openings can have a periodicity along at least one horizontal direction. In one embodiment, the pattern for the openings can be periodic in two orthogonal horizontal directions.

The pattern in the photoresist layer can be transferred into the at least one pad layer (42, 44) to form openings in the at least one pad layer (42, 44). Subsequently, the pattern in the at least one pad layer (42, 44) can be transferred through the top semiconductor layer 30L, the buried insulator layer 20, and an upper portion of the handle substrate 10 or an upper portion of the n-doped epitaxial semiconductor layer, if present, by an anisotropic etch that employs the at least one pad layer (42, 44) as an etch mask. The deep trenches can thus be formed in the SOI substrate (10, 20, 30L) from the pattern of openings in the at least one pad layer (42, 44). The photoresist layer can be removed by ashing, or can be consumed during the etch process that forms the deep trenches.

In one embodiment and as shown in FIG. 1, the sidewalls of the deep trench can be substantially vertically aligned among the various layers (10, 20, 30L) through which the deep trench extends. The depth of the deep trenches as measured from the topmost surface of the SOI substrate (10, 20, 30L) (i.e., the top surface of the top semiconductor layer 30L) to the bottom surface of the deep trenches can be from 500 nm to 10 microns, although lesser and greater depths can also be employed. The width (i.e., the lateral distance between opposite sidewalls) of the deep trenches can be from 40 nm to 150 nm, although lesser and greater width can also be employed.

A buried plate 12 can be first formed by doping a portion of the handle substrate 10 in proximity of sidewalls of each deep trench. Dopants can be introduced, for example, by outdiffusion from a dopant-including disposable material (such as a doped silicate glass) or by ion implantation as known in the art. Further, any other method of forming buried plates 12 in the handle substrate 10 of the SOI substrate (10, 20, 30L) can be employed in lieu of outdiffusion from a dopant-including disposable material or ion implantation.

In one embodiment and if the handle substrate 10 is doped with dopants of a first conductivity, the buried plate 12 can be doped with dopants of a second conductivity type which is opposite the first conductivity type. For example, the first conductivity type can be p-type and the second conductivity type can be n-type, or vice versa. A p-n junction is thus formed between the remaining portion of the handle substrate 10 and each buried plate 12. The dopant concentration in the buried plate 12 can be, for example, from $1.0\times10^{18}/cm^3$ to $2.0\times10^{21}/cm^3$, and typically from $5.0\times10^{18}/cm^3$ to $5.0\times10^{19}/cm^3$, although lesser and greater dopant concentrations can also be employed.

In another embodiment of the present application and when the n-doped epitaxial semiconductor layer is present, a portion of the n-doped semiconductor layer surrounding each deep trench can serve as an outer electrode for each deep trench capacitor subsequently formed and processing steps of forming the buried plates 12 described above can be omitted.

A node dielectric layer (not shown) can be deposited conformally on sidewalls and bottom surfaces of the deep trenches as well as sidewalls and the topmost surface of the at least one pad layer (42, 44). The node dielectric layer can include any dielectric material that can be employed as a node dielectric material in a capacitor known in the art. For example, the node dielectric layer can include at least one of silicon nitride and a dielectric metal oxide material such as high dielectric constant (high-k) dielectric material as known in the art.

An inner electrode layer (not shown) can be deposited to completely fill the deep trenches. The inner electrode layer can include a doped semiconductor material. The doped semiconductor material can be a doped elemental semiconductor material, a doped compound semiconductor material, or an alloy thereof. In one embodiment, the inner electrode layer includes a doped polysilicon. The inner electrode layer can be deposited by PVD, CVD, ALD, electroplating, electroless plating, or a combination thereof. The inner electrode layer is deposited to a thickness that is sufficient to completely fill the deep trenches.

In some embodiments of the present application and before filling the deep trenches with the inner electrode layer, a metal nitride liner layer (not shown) may be conformally deposited over the node dielectric layer by CVD or ALD. In one embodiment, the metal nitride liner layer includes TiN. The metal nitride liner layer is optional and can be omitted.

The inner electrode layer is vertically recessed to a level between the top surface of the buried insulator layer 20 and the bottom surface of the buried insulator layer 20 by a recess etch. The recess etch of the conductive material layer can employ an anisotropic etch such as a reactive ion etch (RIE), an isotropic etch such as a wet chemical etch, or a combination thereof. The recess etch can be selective to the material of the node dielectric layer. Each remaining portion of the inner electrode layer within the deep trenches constitutes an inner electrode 16. The topmost surface of each inner electrode 16 is substantially planar, and is located between the top surface of the buried insulator layer 20 and the bottom surface of the buried insulator layer 20.

The physically exposed portions of the node dielectric layer that are not covered by the inner electrode 16 can be removed by another recess etch, which can be a dry etch, such as, for example, RIE. Each remaining portion of the node dielectric layer within the deep trenches constitutes a node dielectric 14. The topmost surface of the node dielectric 14 is coplanar with the topmost surface of the inner electrode 16.

Each set of a buried plate 12 around a deep trench, a node dielectric 14, and an inner electrode 16 constitutes a trench capacitor (12, 14, 16). The buried plate 12 is an outer electrode of the trench capacitor, the inner electrode 16 is the inner electrode of the trench capacitor, and the node dielectric 14 is the dielectric separating the outer electrode (i.e., the buried plate 12) from the inner electrode 16. The trench capacitor (12, 14, 16) is embedded within the SOI substrate (10, 20, 30L). The buried insulator layer 20 overlies, and contacts the buried plates 12. A cavity 40 is formed above the node dielectric 42 and the inner electrode 44 within each deep trench.

Figure 2A:
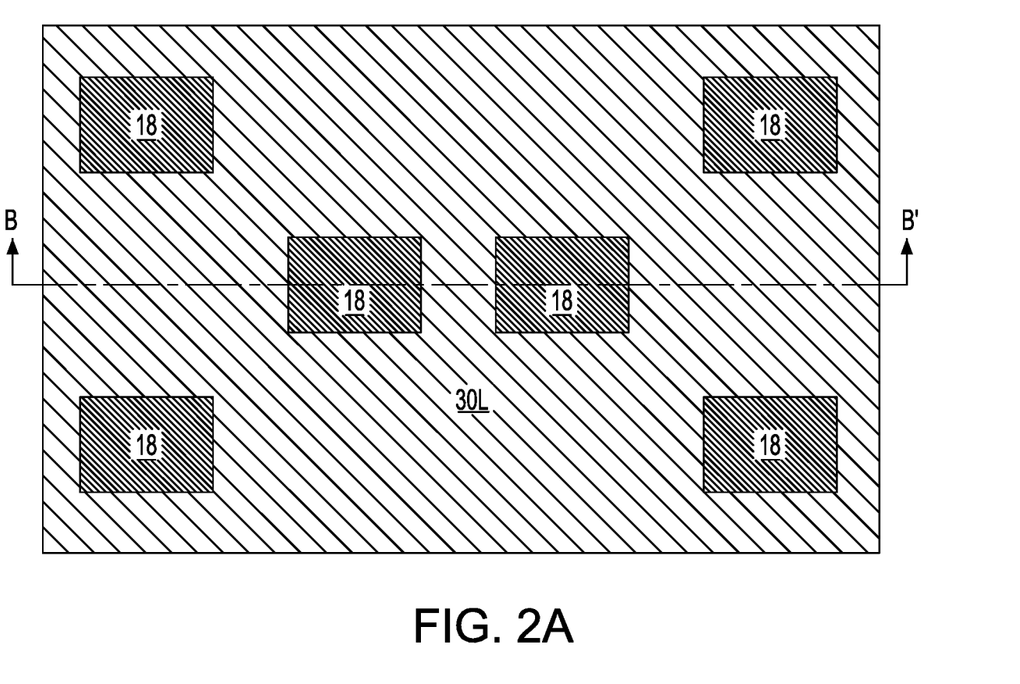
FIG. 2A is a top-down view of the exemplary semiconductor structure of FIGS. 1A and 1B after forming conductive material caps over the deep trench capacitors.
Figure 2B:
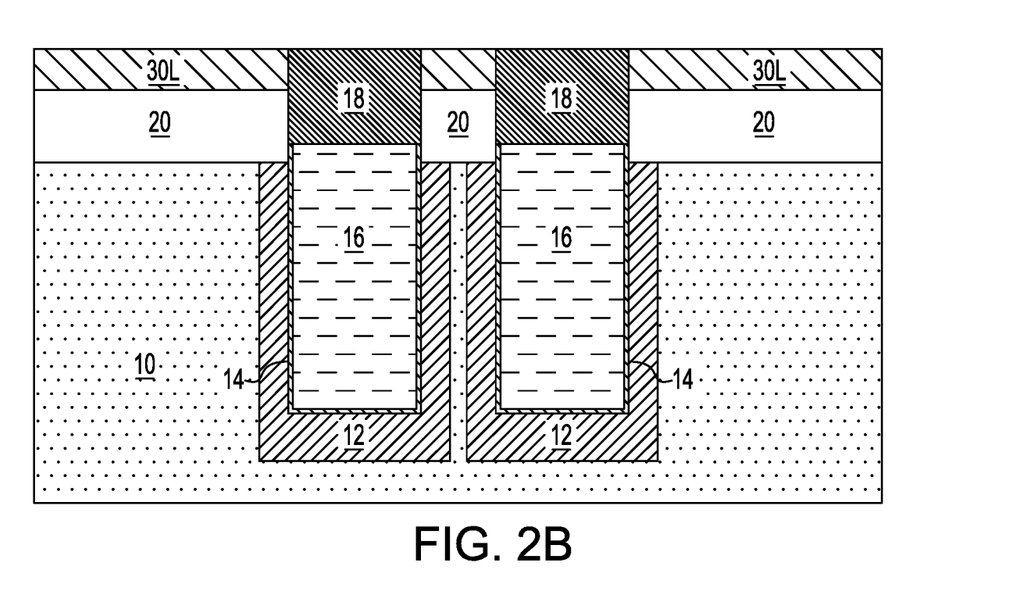
FIG. 2B is a cross-sectional view of the exemplary semiconductor structure of FIG. 2A along the vertical plane B-B'.

Referring to FIGS. 2A and 2B, conductive material caps 18 are formed within the cavities 40 and on top of the node dielectric 14 and the inner electrode 16. The conductive material caps 18 can be formed by depositing a conductive material in the cavities 40 and above the at least one pad layer (42, 44), and subsequently recessing the deposited conductive material. In one embodiment, the conductive material can be a doped elemental semiconductor material such as doped polysilicon. The conductive material can be deposited by CVD or PVD with in-situ doping of p-type dopants or n-type dopants. The conductive material may be deposited to a thickness that is sufficient to completely fill the cavities 40.

The conductive material can be planarized, for example, by chemical mechanical planarization (CMP) employing the pad nitride layer 44 as a stopping layer. Subsequently, the conductive material is recessed to a depth at the top surface of the top semiconductor layer 30L to provide the conductive material portions 18. In one embodiment and as shown in FIG. 2, the top surfaces of the conductive strap structures 18 are substantially coplanar with the top surface of the top semiconductor layer 30L. A recess etch which can be an anisotropic etch such as RIE may be employed to form the conductive material portions 18. Each conductive material cap 18 is in contact with, and overlies, an inner electrode 16.

Subsequently, the at least one pad layer (42, 44) is removed by at least one etch that is selective to the semiconductor materials of the top semiconductor layer 30L and the conductive material portions 18. For example, if the pad nitride layer 44 includes silicon nitride and the pad oxide layer 42 includes silicon dioxide, a wet chemical etch employing hot phosphoric acid can be utilized to etch the pad nitride layer 44 and a wet chemical etch employing hydrofluoric acid can be utilized to etch the pad oxide layer 42.

Figure 3A:
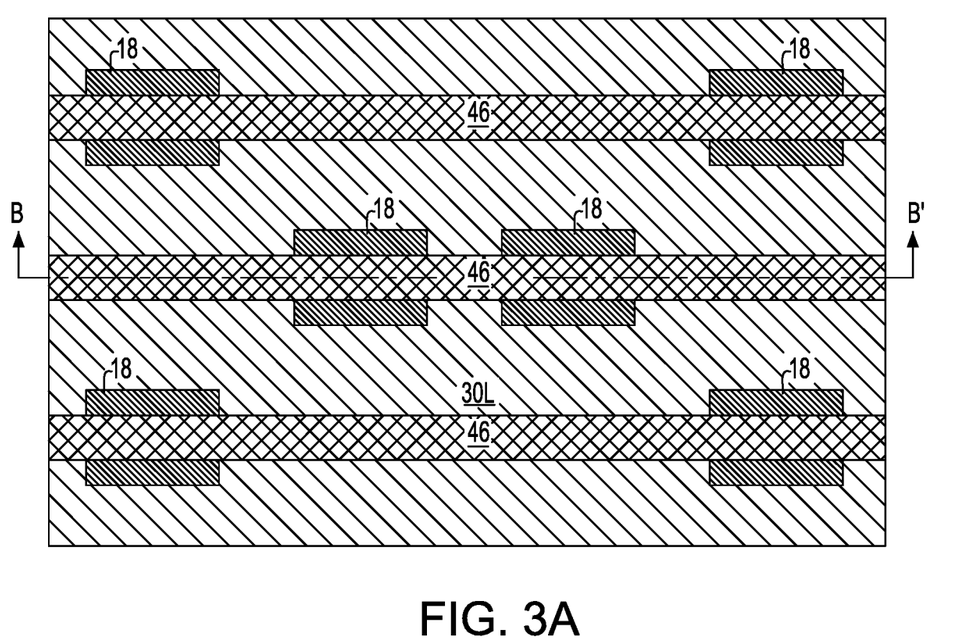
FIG. 3A is a top-down view of the exemplary semiconductor structure of FIGS. 2A and 2B after forming fin-defining mask structures over a top semiconductor layer of the SOI substrate and the conductive material caps.
Figure 3B:
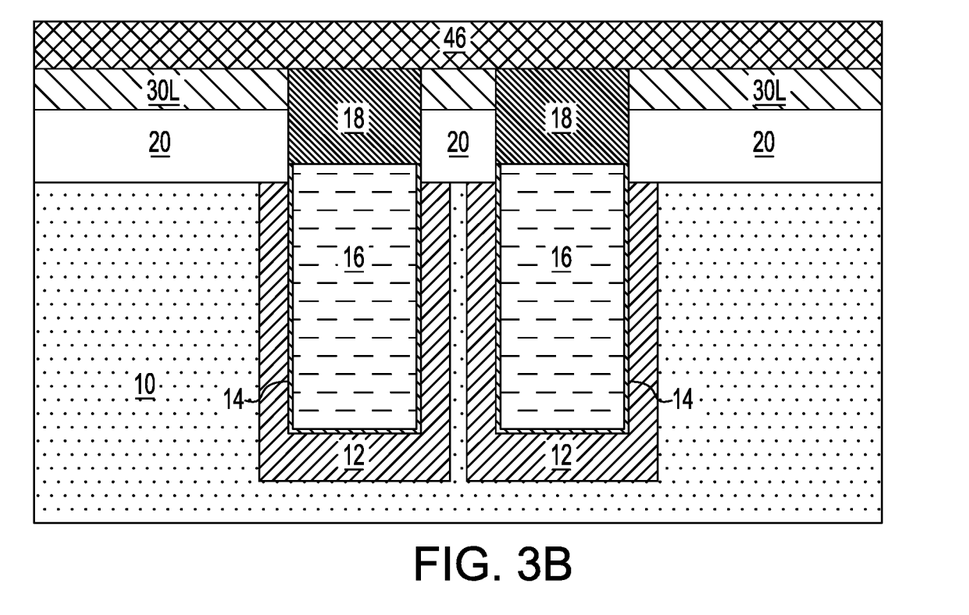
FIG. 3B is a cross-sectional view of the exemplary semiconductor structure of FIG. 3A along the vertical plane B-B'.

Referring to FIGS. 3A and 3B, fin-defining mask structures 46 are formed on top surfaces of the top semiconductor layer 30L and the conductive material caps 18. The fin-defining mask structures 46 are mask structures that cover the regions of the top semiconductor layer 30L from which semiconductor fins are subsequently formed. In one embodiment, each of the fin-defining mask structures 46 can have a rectangular shape and extends along a lengthwise direction. As used herein, a "lengthwise" direction of an object refers to a direction along which the object extends the most. The width (i.e., the lateral distance between opposite sidewalls extending along the lengthwise direction) of the fin-defining mask structures 46 can be from 5 nm to 30 nm, although lesser and greater thicknesses can also be employed.

In one embodiment, the fin-defining mask structures 46 can be patterned portions of a dielectric hardmask layer. The fin-defining mask structures 46 can be formed, for example, by first depositing a dielectric hardmask layer (not shown) over the top semiconductor layer 30L and the conductive material caps 18 and lithographically patterning the dielectric hardmask layer. The dielectric hardmask layer includes a dielectric material such as silicon dioxide, silicon nitride, a dielectric metal oxide, or a combination thereof. In one embodiment, the dielectric hardmask layer includes silicon nitride. The dielectric hardmask layer can be deposited by CVD or ALD. The thickness of the dielectric hardmask layer that is formed can be from 20 nm to 200 nm, although lesser and greater thicknesses can also be employed. The patterning of the dielectric hardmask layer can be performed, for example, by application and lithographic patterning of a photoresist layer, and transfer of the patterns in the photoresist layer into the dielectric material layer by an etch, which can be an anisotropic etch such as RIE. Remaining portions of the photoresist layer can be removed, for example, by ashing.

In another embodiment, the fin-defining mask structures 46 can be formed by a sidewall image transfer (SIT) process. Specifically, after the formation of the dielectric hardmask layer over the top semiconductor layer 30L and the conductive material portions 18, a mandrel material layer (not shown) is deposited over the dielectric hardmask layer. The mandrel material layer may be composed of amorphous silicon, polysilicon, amorphous or polycrystalline germanium, an amorphous or polycrystalline silicon-germanium alloy material, amorphous carbon, diamond-like carbon, or organosilicate glass. The mandrel material layer can be deposited using, for example, CVD or PECVD. The thickness of the mandrel material layer can be from 50 nm to 300 nm, although lesser and greater thicknesses can also be employed. The mandrel material layer then undergoes lithographic and etching processes to form mandrels (not shown). Next, a conformal spacer material layer (not shown) is deposited over the mandrels and exposed portions of the dielectric hardmask layer by a conformal deposition process such as, for example, CVD or ALD. The thickness of the spacer material layer may vary depending upon the desired width of final semiconductor fins to be formed in the top semiconductor layer 30L, and can be from 5 nm to 30 nm, although lesser and greater thicknesses can also be employed. The spacer material layer may include a dielectric material such as silicon dioxide or silicon oxynitride. Horizontal portions of the conformal spacer material layer are then removed utilizing an anisotropic etch, such as, for example, RIE to provide spacers which are remaining portions of the spacer material layer on the sidewalls of the mandrels. The mandrels are removed selective to the spacers, leaving the spacers on top of the dielectric hardmask layer. The removal of the mandrels can be performed, for example, by a wet chemical etch or a dry etch such as RIE. The dielectric hardmask layer is subsequently patterned by an anisotropic etch using the spacers as an etch mask to provide the fin-defining mask structures 46. The spacers are then removed by, for example, a wet chemical etch.

Figure 4A:
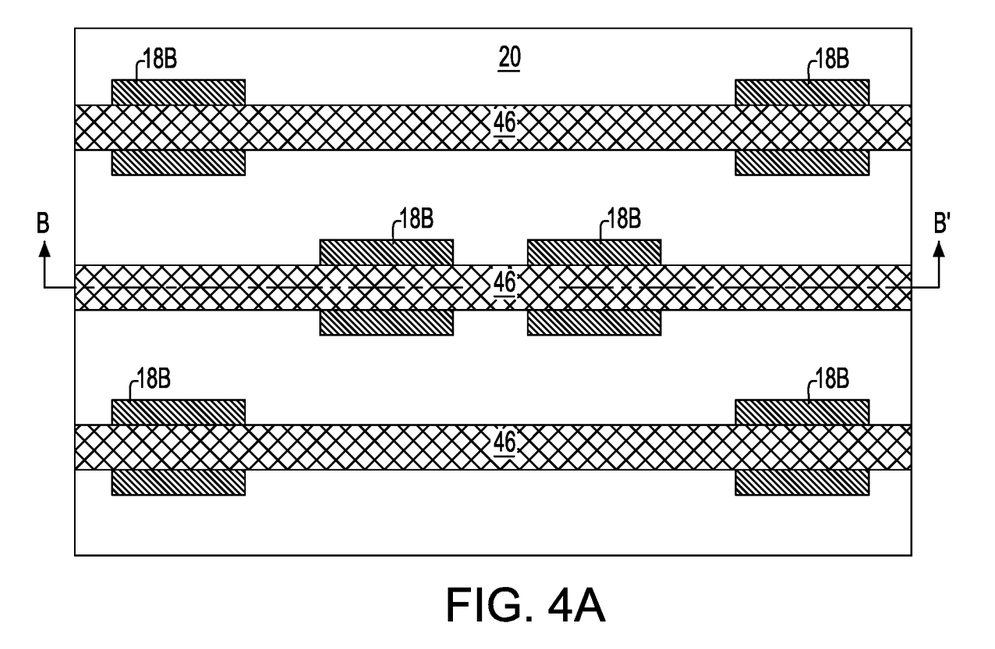
FIG. 4A is a top-down view of the exemplary semiconductor structure of FIGS. 3A and 3B after forming semiconductor layer portions and conductive strip structures by patterning the top semiconductor layer and the conductive material caps.
Figure 4B:
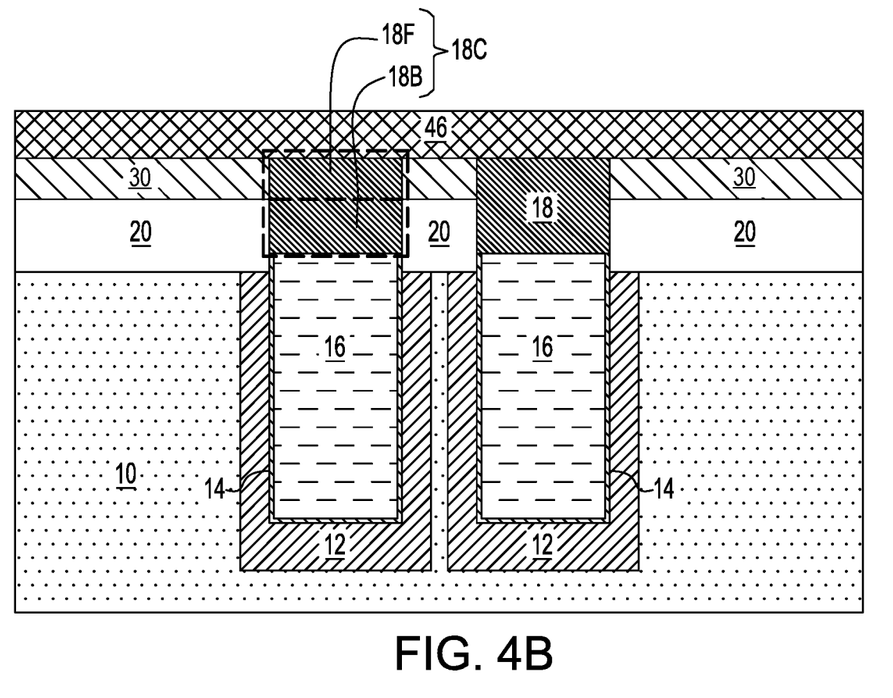
FIG. 4B is a cross-sectional view of the exemplary semiconductor structure of FIG. 4A along the vertical plane B-B'.

Referring to FIGS. 4A and 4B, physically exposed portions of the top semiconductor layer 30L and the conductive material caps 18 are anisotropically etched employing the fin-defining mask structures 46 as an etch mask to provide semiconductor layer portions 30 which are remaining portions of the top semiconductor layer 30L and conductive strap structures 18C which are remaining portions of the conductive material caps 18. As shown in FIG. 4B, each conductive strap structure 18C includes a base portion 18B vertically contacting the inner electrode 16 and a fin portion 18F extending from the base portion 18B and laterally contacting a semiconductor layer portion 30. In one embodiment, the anisotropic etch can be a dry etch such as RIE that removes the semiconductor materials of the top semiconductor layer 30L and the conductive material caps 18 selective to the dielectric material of the buried insulator layer 20. The top surface of the buried insulator layer 20 is thus exposed after the patterning of the top semiconductor layer 30L and the conductive material caps 18.

Figure 5A:
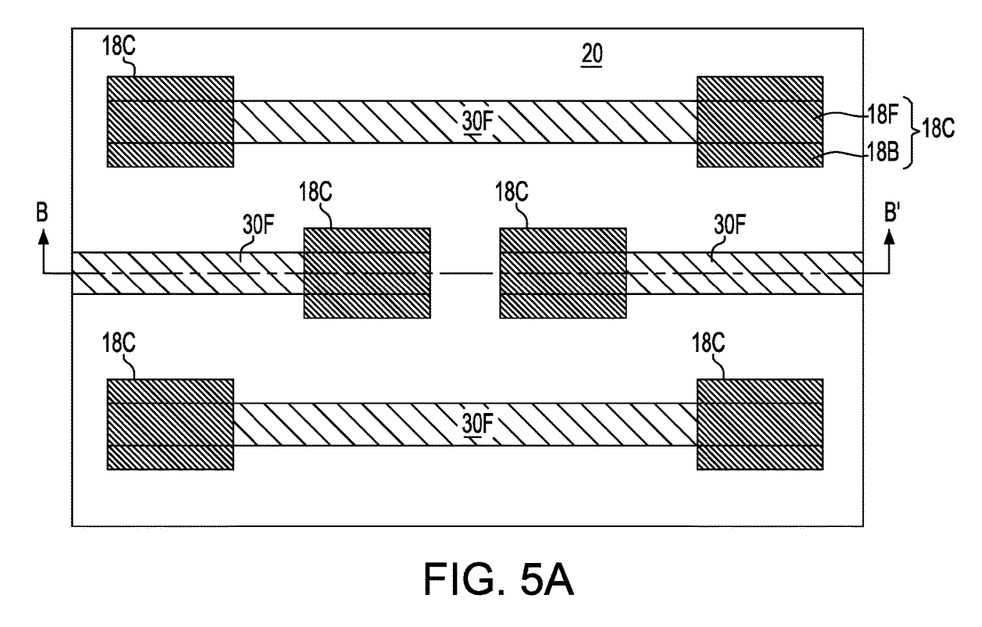
FIG. 5A is a top-down view of the exemplary semiconductor structure of FIGS. 4A and 4B after forming semiconductor fins.
Figure 5B:
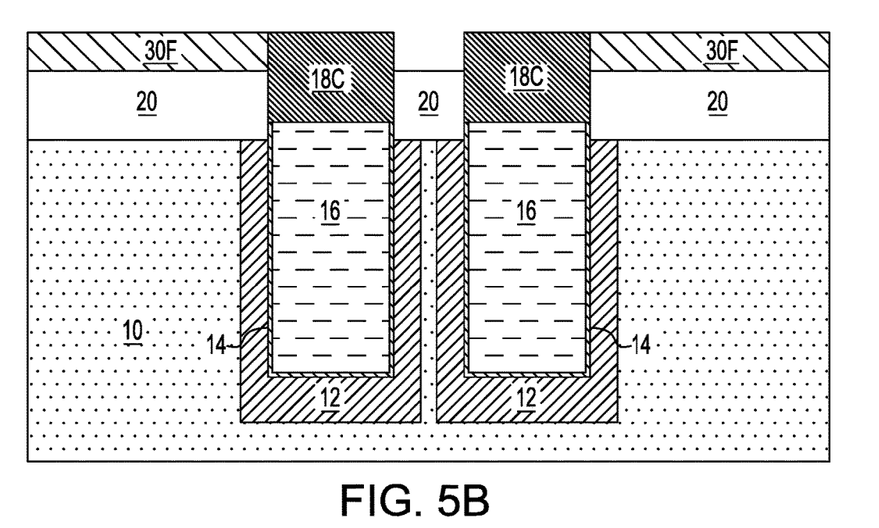
FIG. 5B is a cross-sectional view of the exemplary semiconductor structure of FIG. 5A along the vertical plane B-B'.

Referring to FIGS. 5A and 5B, unwanted portions of the semiconductor layer portions 30 are removed to form semiconductor fins 30F. A mask layer (not shown) is first applied over the fin-defining mask structures 46, the conductive strap structures 18C and the buried insulator layer 20. The mask layer can be a photoresist layer or a photoresist layer in conjunction with hardmask layer(s). The mask layer is lithographically patterned to form a pattern of openings therein. The openings overlie unwanted portions of the semiconductor layer portions 30 to be subsequently removed.

Portions of the fin-defining mask structures 46 and the underlying unwanted portions of the semiconductor layer portions 30 that are not covered by the patterned mask layer are removed. An anisotropic etch, which can be a dry etch or a wet chemical etch, may be performed to remove the materials of the fin-defining mask structures 46 and the semiconductor layer portions 30 selective to materials of the buried insulator layer 20. The remaining portions of the semiconductor layer portions 30 are herein referred to as semiconductor fins 30F. Each semiconductor fin 30F laterally contacts the fin portion 18F of the conductive strap structure 18C. Upon formation of the semiconductor fins 30F, the patterned mask layer can be removed by oxygen-based plasma etching.

Subsequently, remaining portions of the fin-defining mask structures 46 can be removed from the top of semiconductor fins 30F by an etch, which can be a wet chemical etch or a dry etch. In one embodiment and when the buried insulator layer 20 is composed of silicon dioxide and the fin-defining mask structures 46 are composed of silicon nitride, a wet chemical etch employing hot phosphoric acid can be employed to remove the fin-defining mask structures 46 from the top of the semiconductor fins 30F.

Figure 6A:
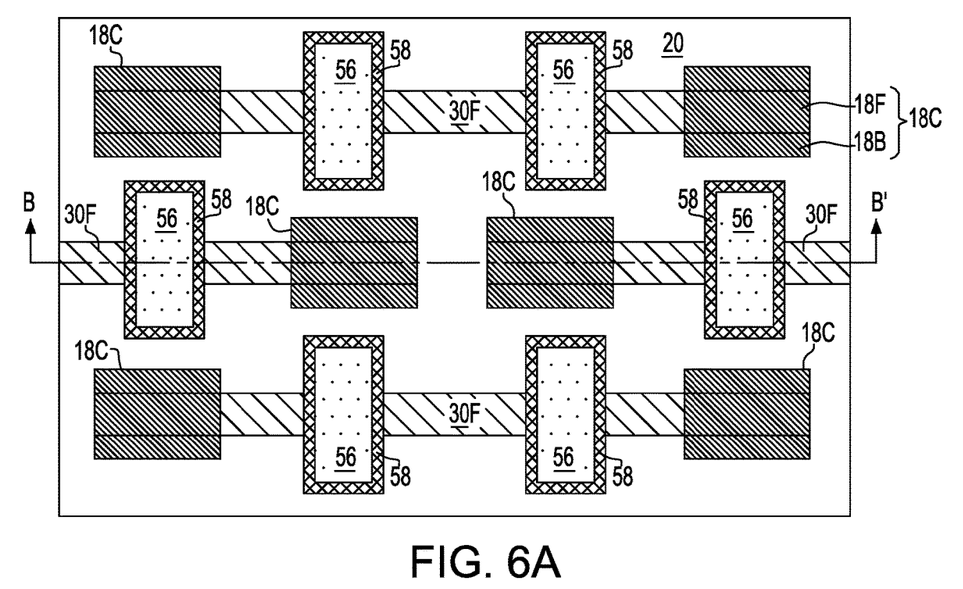
FIG. 6A is a top-down view of the exemplary semiconductor structure of FIGS. 5A and 5B after forming gate stacks over semiconductor fins and first gate spacers on sidewalls of the gate stacks.
Figure 6B:
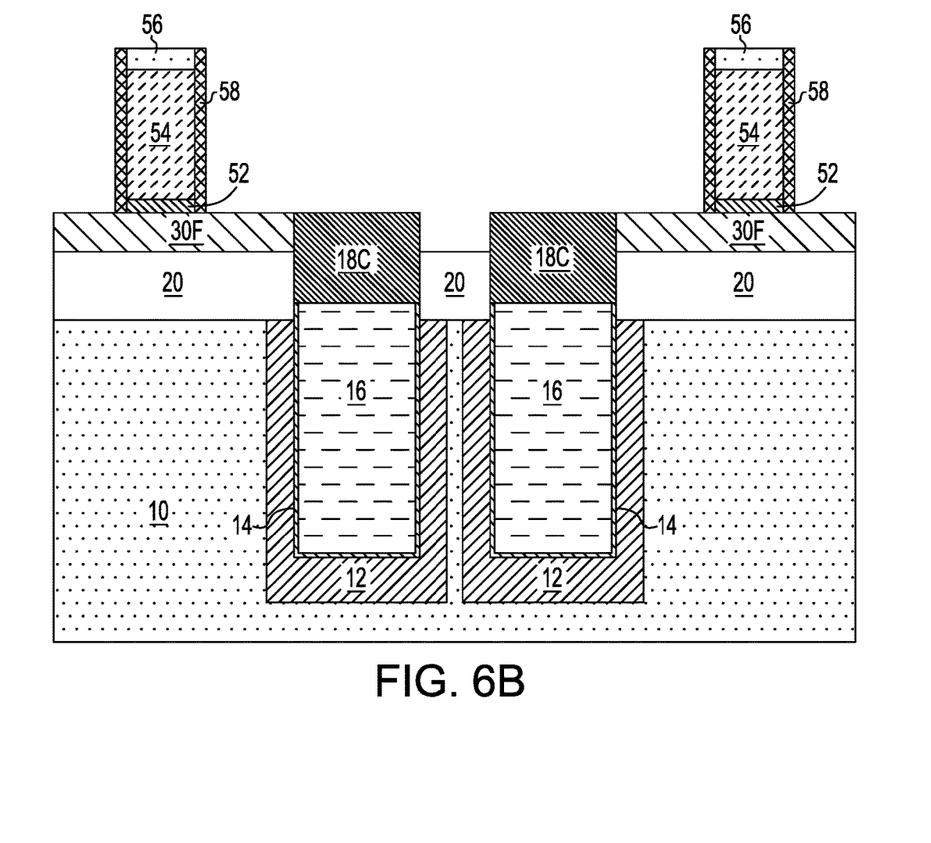
FIG. 6B is a cross-sectional view of the exemplary semiconductor structure of FIG. 6A along the vertical plane B-B'.

Referring to FIGS. 6A and 6B, gate stacks are formed straddling portions of the semiconductor fins 30F. Each gate stack (52, 54, 56) is located on a top surface and opposing sidewalls a semiconductor fin 30F, thus forming a trigate FinFET. Each gate stack includes, from bottom to top, a gate dielectric 52, a gate electrode 54 and a gate cap 56. The gate stacks (52, 54, 56) may be formed by first providing a gate material stack (not shown) that includes, from bottom to top, a gate dielectric layer, a gate electrode layer and a gate cap layer over the semiconductor fins 30F, the conductive strap structures 18C and the buried insulator layer 20.

The gate dielectric layer can be formed by converting surface portions of the semiconductor fins 30F into a dielectric semiconductor-containing material such as a dielectric semiconductor oxide, a dielectric semiconductor nitride, a dielectric semiconductor oxynitride, or a combination thereof. For example, if the semiconductor fins 30F include silicon, the dielectric semiconductor-containing material can be silicon dioxide, silicon nitride, silicon oxynitride, or a combination thereof. The thickness of the gate dielectric layer can be, for example, from 0.5 nm to 6 nm, although lesser and greater thicknesses can also be employed. Alternately or additionally, the gate dielectric layer can be formed by depositing a dielectric material. In one embodiment, the material of the gate dielectric layer can be deposited by a conformal deposition method such as ALD or CVD. In one embodiment, the deposited dielectric material can include a dielectric semiconductor oxide such as silicon dioxide. In another embodiment, the deposited dielectric material can include a dielectric metal oxide, a dielectric metal nitride, and/or a dielectric metal oxynitride. In one embodiment, the deposited dielectric material can include a high-k dielectric material known in the art. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

The gate electrode layer includes a conductive material, which can include a doped semiconductor material such as doped polysilicon, a metallic material such as Al, Au, Ag, Cu or W, or combinations thereof. The gate electrode layer can be deposited, for example, by CVD, PVD, or any other known method for depositing a conductive material. The thickness of the gate electrode layer, as measured in planar regions, can be from 20 nm to 300 nm, although lesser and greater thicknesses can also be employed.

The dielectric gate cap layer includes a dielectric material such as silicon nitride, silicon dioxide, silicon oxynitride, and/or a dielectric metal oxide. The dielectric gate cap layer can be deposited, for example, by CVD. The thickness of the dielectric gate cap layer can be from 5 nm to 50 nm, although lesser and greater thicknesses can also be employed.

The gate material stack can then be patterned by lithography and etching to form the gate stacks (52, 54, 56). Specifically, a photoresist layer (not shown) is applied over the topmost surface of the gate material stack and is lithographically patterned by lithographic exposure and development. The pattern in the photoresist layer is transferred into the material stack by an etch, which can be an anisotropic etch such as RIE. The remaining portions of the material stack after the pattern transfer constitute the gate stack (52, 54, 56). The patterned photoresist layer may be subsequently removed by, for example, ashing.

After formation of the gate stack (52, 54, 56), a first gate spacer is 58 formed on each sidewall of the gate stacks (52, 54, 56). The first gate spacers 58 may include a dielectric material such as, for example, an oxide, a nitride, an oxynitride, or any combination thereof. For example, the first gate spacers 58 may be composed of silicon nitride, silicon boron carbon nitride, or silicon carbon oxynitride. The first gate spacers 58 can be formed by first providing a conformal first gate spacer material layer (not shown) on exposed surfaces of the gate stacks (52, 54, 56), the semiconductor fins 30F, the conductive strap structures 18C and the buried insulator layer 20 and then etching the conformal first gate spacer material layer to remove horizontal portions of the conformal gate spacer material layer. The etch is continued until the first gate spacer material is removed from the sidewalls of the semiconductor fins 30F. The conformal first gate spacer material layer can be formed by a deposition process including, for example, CVD, PECVD, or PVD. The etching of the conformal first gate spacer material layer may be performed by a dry etch process such as, for example, RIE. The remaining portions of the conformal first gate spacer material layer present on sidewalls of the gate stacks (52, 54, 56) constitute the first gate spacer(s) 58. The width of each first gate spacer 58, as measured at the base of the first gate spacer 58 can be from 5 nm to 20 nm, although lesser and greater widths can also be employed.

In some embodiments of the present application, the gate stacks (52, 54, 56) are sacrificial gate stacks for a replacement gate process and can be replaced with functional gate stacks after the formation of the fully alloyed source/drain regions described below. The term "sacrificial gate stack" as used herein denotes a structure that serves as a placeholder for a functional gate stack to be subsequently formed. The term "functional gate stack" as used herein denotes a permanent gate stack used to control output current (i.e., flow of carriers in the channel) of a semiconducting device through electrical fields.

Figure 7A:
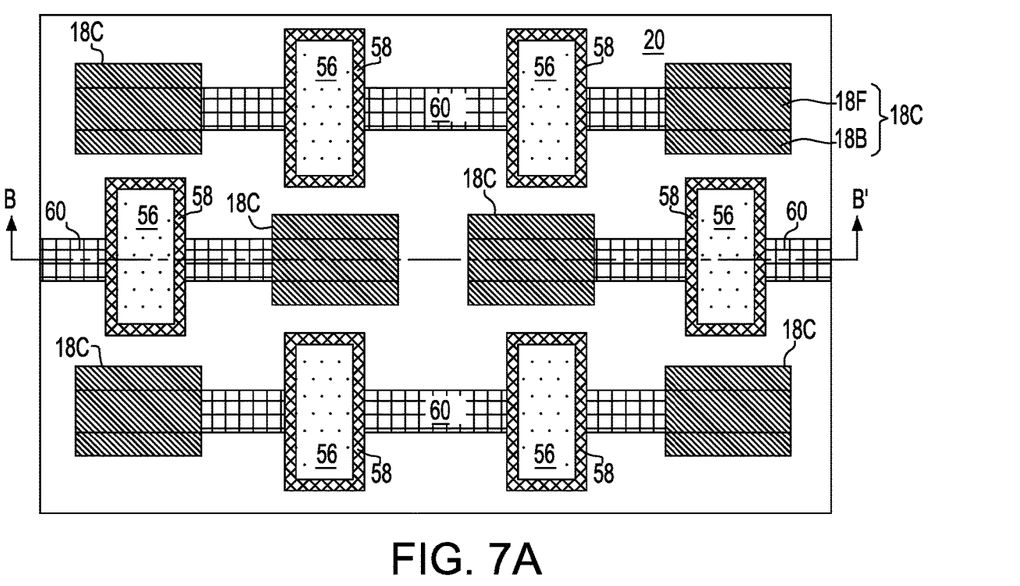
FIG. 7A is a top-down view of the exemplary semiconductor structure of FIGS. 6A and 6B after forming source/drain regions in portions of the semiconductor fins on opposite sides of the gate stacks.
Figure 7B:
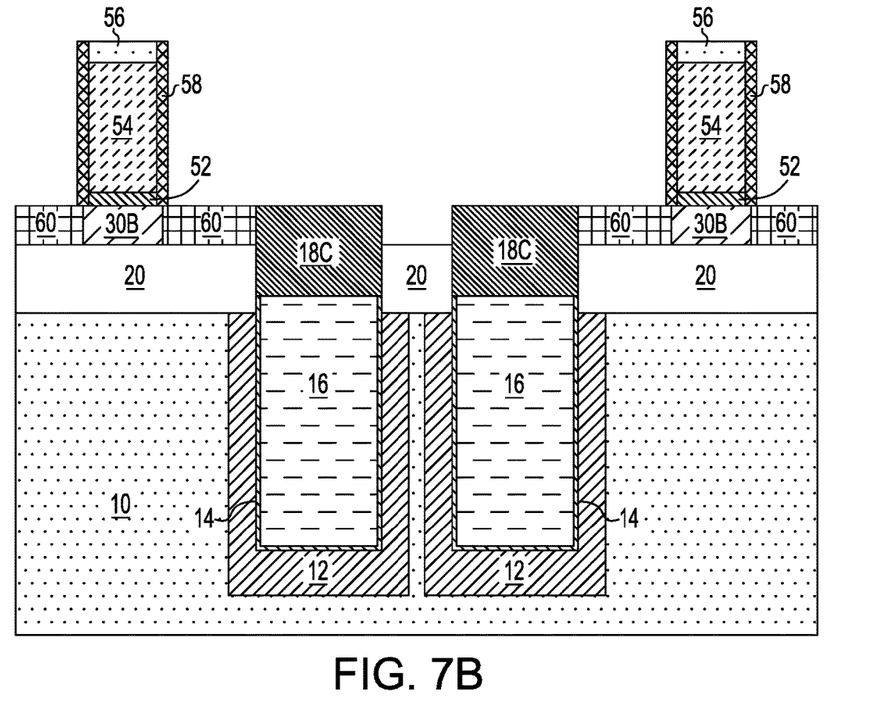
FIG. 7B is a cross-sectional view of the exemplary semiconductor structure of FIG. 7A along the vertical plane B-B'.

Referring to FIGS. 7A and 7B, source regions and drain regions (collectively referred to as source/drain regions 60) are formed in portions of the semiconductor fins 30 located on opposite sides of the gate stacks (52, 54, 56). As used herein, a "source/drain" region can be a source region or a drain region depending on subsequent wiring and application of voltages during operation of a FinFET. Each "source/drain" region also includes a source/drain extension region as known in the art. The source/drain regions 60 can be formed by an ion implantation employing the gate stacks (52, 54, 56) and the gate spacers 58 as an implantation mask. Specifically, p-type or n-type dopants can be implanted into portions of the semiconductor fins 30F that are not covered by the gate stack (52, 54, 56) and the gate spacers 58. The implanted portions of the semiconductor fins 30F constitute source/drain regions 60. The unimplanted portions of the semiconductor fins 30F constitute body regions 30B of a field effect transistor which is an access transistor that controls the flow of electrical charges into, and out of, the inner electrode 16 of one of the deep trench capacitors (12, 14, 16) to which the access transistor is connected.

In one embodiment, the body regions 30B can have a doping of a first conductivity type, and the implanted dopants can have a doping of a second conductivity type that is the opposite of the first conductivity type. For example, the first conductivity type can be p-type and the second conductivity type can be n-type, or vice versa. In this case, the source regions 30S and the drain regions 30D can have a doping of the second conductivity type.

An activation anneal can be subsequently performed to activate the implanted dopants in the source/drain regions 60.

Figure 8A:
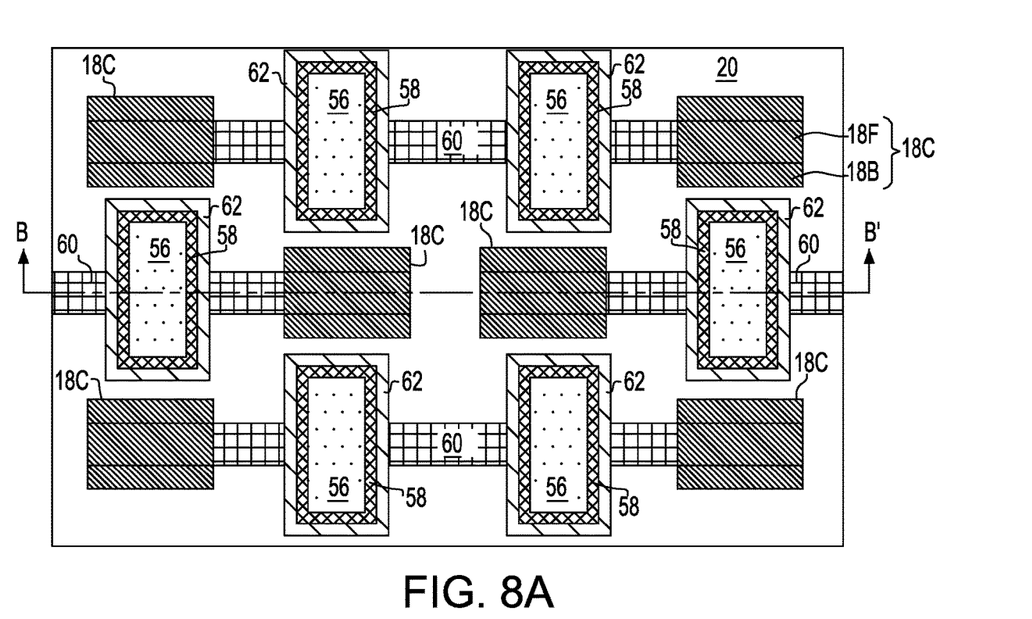
FIG. 8A is a top-down view of the exemplary semiconductor structure of FIGS. 7A and 7B after forming second gate spacers on sidewalls of the first gate spacers.
Figure 8B:
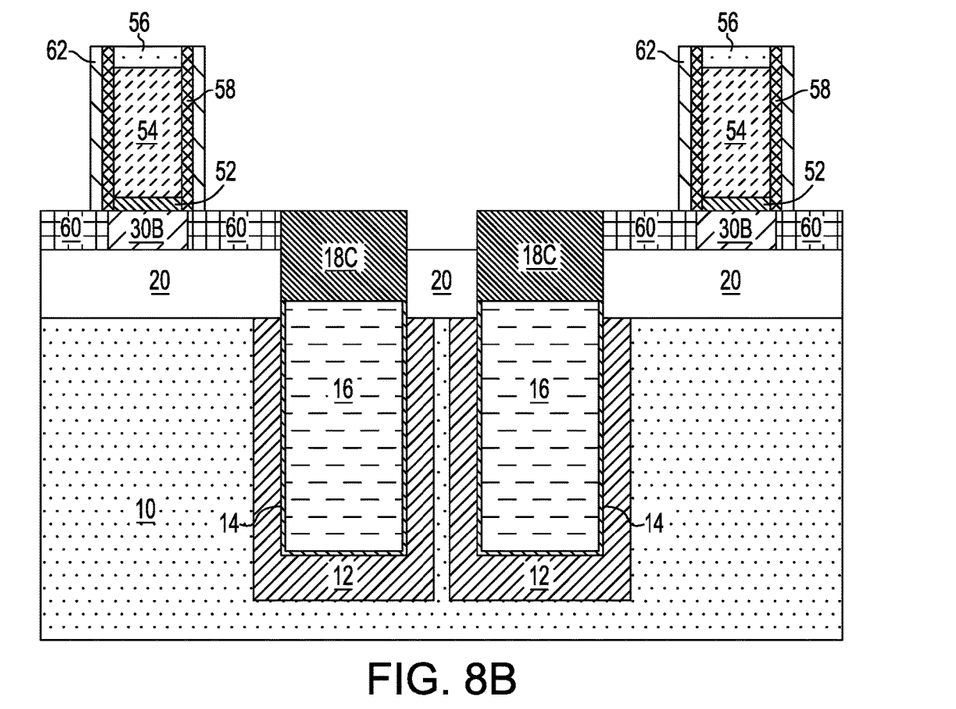
FIG. 8B is a cross-sectional view of the exemplary semiconductor structure of FIG. 8A along the vertical plane B-B'.

Referring to FIGS. 8A and 8B, second gate spacers 62 are formed on top of the source/drain regions 60. Each second gate spacer 62 is adjoined to an outer sidewall of the first gate spacers 58. The second gate spacers 62 can include a dielectric material that is the same as, or different from, the dielectric material of the first gate spacers 58. The processing techniques and thickness ranges described above for the first gate spacers 58 are also applicable here for the formation of the second gate spacers 62.

Figure 9A:
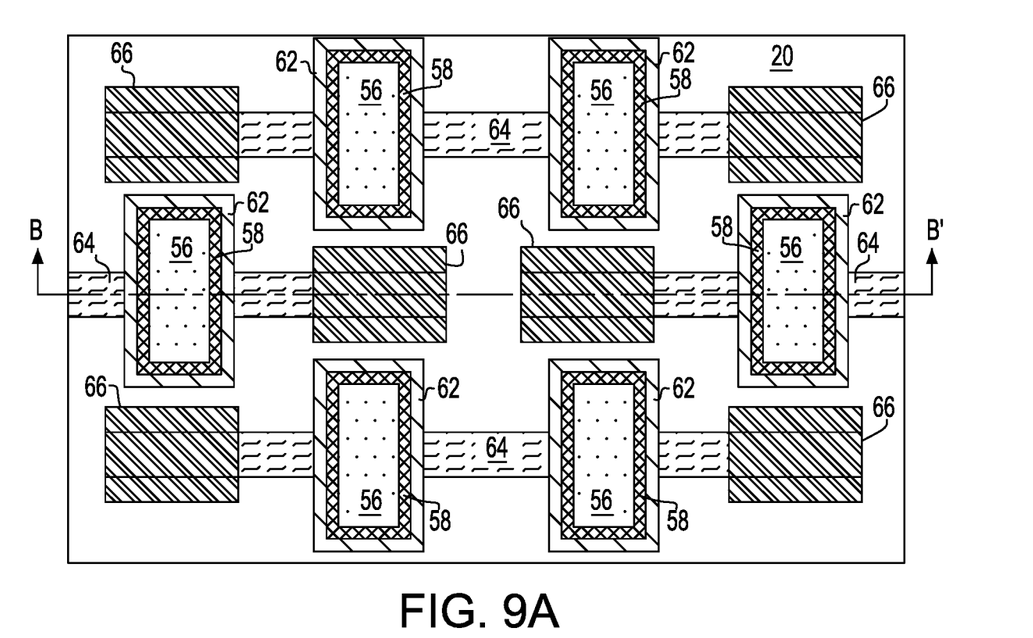
FIG. 9A is a top-down view of the exemplary semiconductor structure of FIGS. 8A and 8B after forming fully alloyed source/drain regions and alloyed conductive strap structures.
Figure 9B:
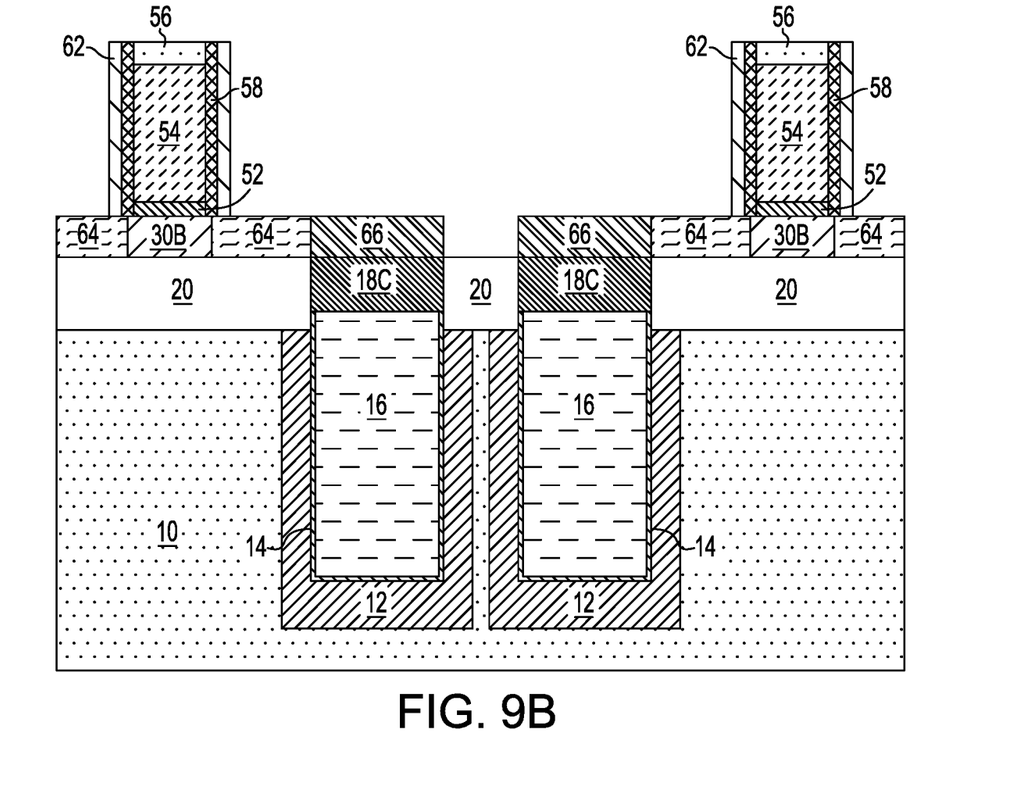
FIG. 9B is a cross-sectional view of the exemplary semiconductor structure of FIG. 9A along the vertical plane B-B'.

Referring to FIGS. 9A and 9B, a metal semiconductor alloy process is performed to consume all of the source/drain regions 60, thereby forming metal semiconductor alloy source/drain regions (herein referred to as fully alloyed source/drain regions 64). The metal semiconductor alloy includes a metal silicide or a metal germicide. The metal semiconductor alloy process also converts the fin portion 18F and at least a top portion of the base portion 18B of each of the conductive strap structures 18C into a metal semiconductor alloy, thus forming metal semiconductor alloy conductive strap structures (herein referred to as alloyed conductive strap structures 66).

The fully alloyed source/drain regions 64 and the alloyed conductive strap structure 66 can be formed by first depositing a metal layer on the exposed surfaces of the source/drain regions 60, the gate stacks (52, 54, 56), the first gate spacers 58, the second gate spacers 62 and the buried insulator layer 20. The metal layer may include a metal such as Ni, Co, Pt, W, Ti, Ta, a rare earth metal (e.g., Er, Yt, La), an alloy thereof, or any combination thereof. The metal layer may be deposited by CVD, PVD or ALD. The thickness of the metal layer is selected such that entire source/drain regions 60 are converted into a metal semiconductor alloy. In one embodiment, the metal layer can have a thickness ranging from 2 nm to 20 nm, although lesser and grater thicknesses can also be employed. In one embodiment, the thickness of the metal layer is 4 nm.

The deposited metal layer is subsequently subjected to an annealing process, such as a thermal annealing process or a laser annealing process, to induce reaction of the metal in the metal layer and the semiconductor materials of the source/drain regions 60 and the conductive strap structures 18C to provide the fully alloyed source/drain regions 64 and the alloyed conductive strap structures 66. The unreacted portion of the metal layer is then removed, for example, by an etch, which can be a wet chemical etch that removes the metal in the metal layer selective to the metal semiconductor alloys in the fully alloyed source/drain regions 64 and the alloyed conductive strap structures 66.

Access transistors are thus formed. Each access transistor includes a gate structure (52, 54, 56) overlying a body region 30B of a semiconductor fin 30F and fully alloyed source/drain regions 64 laterally surrounding the body region 30B and is electrically connected to a deep trench capacitor (12, 14, 16) through a alloyed conductive strap structure 66.

The fully alloyed source/drain regions 64 of the present application can reduce Ron, thus increasing Ion of the FinFETs. In the present application because no selective epitaxy is needed to form raised source/drain regions to reduce Ron of the FinFETs, the electrical shorts caused by the epitaxial growth of a semiconductor material on both the source/drain regions 60 and the conductive strap structures 18C are prevented.

Figure 10A:
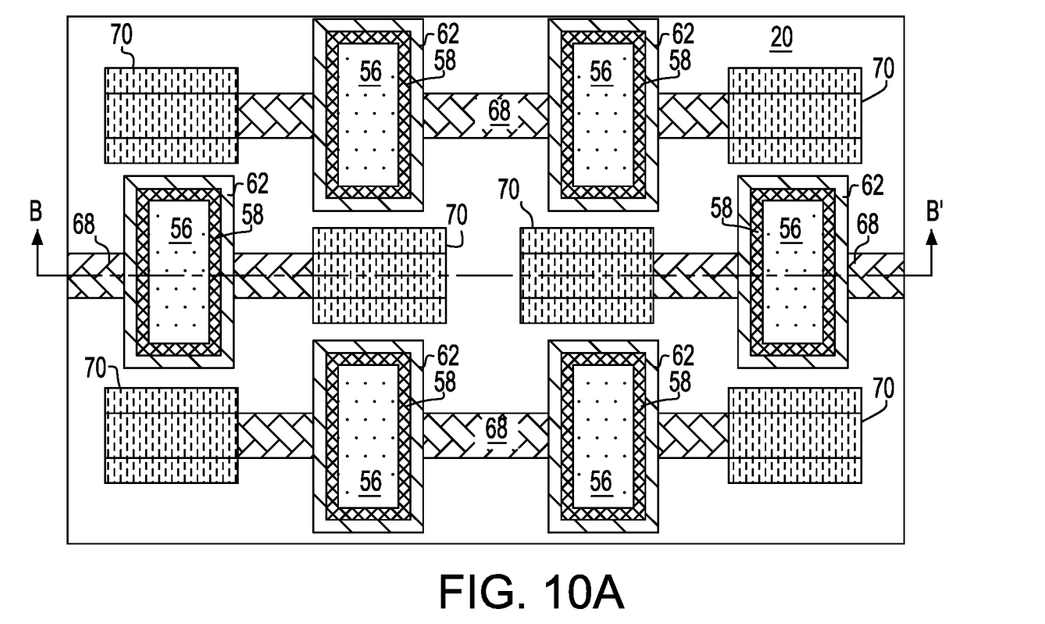
FIG. 10A is a top-down view of the exemplary semiconductor structure of FIGS. 9A and 9B after implanting ions into the fully alloyed source/drain regions and the alloyed conductive strap structures.
Figure 10B:
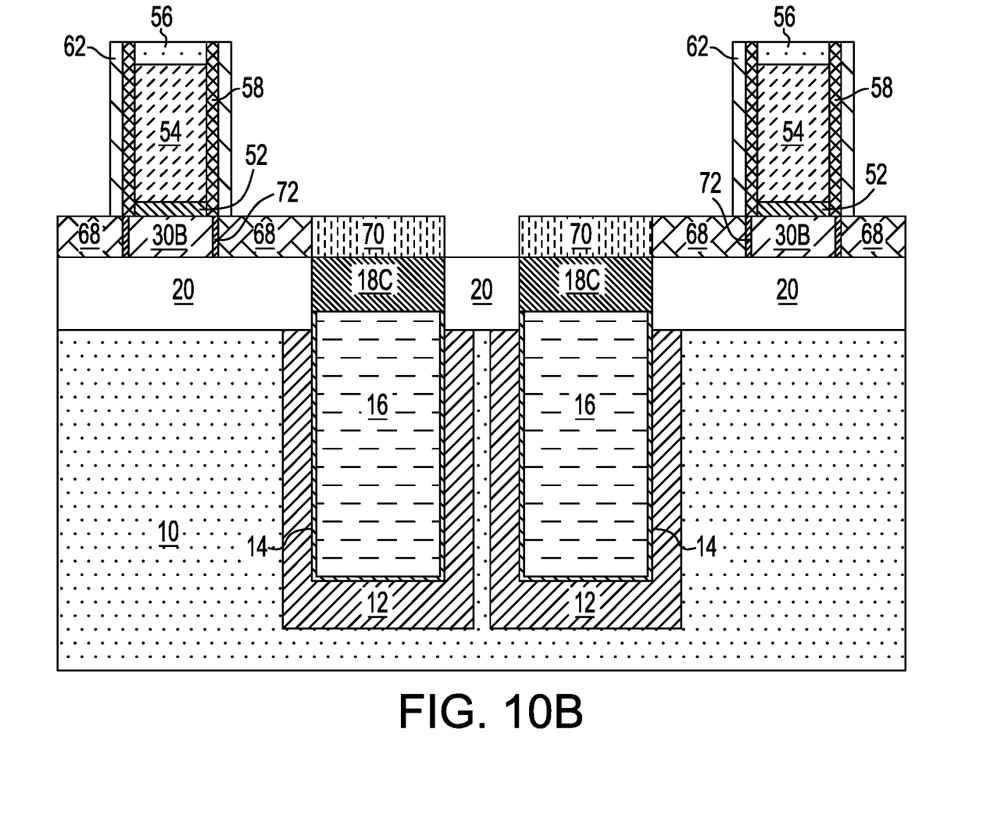
FIG. 10B is a cross-sectional view of the exemplary semiconductor structure of FIG. 10A along the vertical plane B-B'.

Referring to FIGS. 10A and 10B, dopants (e.g., B for p-type FinFETs, P for n-type FinFETs) are implanted into the fully alloyed source/drain regions 64 and the alloyed conductive strap structures 66 by a post-alloyzation ion implantation to form doped fully alloyed source/drain regions 68 and doped alloyed conductive strap structures 70. The doped fully alloyed source/drain regions 68 and doped alloyed conductive strap structures 70 are then anneal to segregate implanted dopants to the metal semiconductor alloy/semiconductor interface, thereby creating a segregated interfacial dopant layer 72 between each adjacent pair of the doped fully alloyed source/drain regions 68 and the body regions 30B. A low temperature rapid thermal anneal at a temperature less than 700° C. or a laser anneal is typically performed to segregate implanted dopants. The segregated interfacial dopant layer 72 effectively inhibits metal semiconductor alloy encroachment caused by the diffusion of the metal in the metal semiconductor alloy into the body regions 30B of the semiconductor fins 30F.

While the application has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the application is intended to encompass all such alternatives, modifications and variations which fall within the scope and spirit of the application and the following claims.

What is claimed is:

1. A method of forming a semiconductor structure comprising:
   forming a deep trench capacitor in a substrate, wherein the deep trench capacitor comprises an inner electrode, a node dielectric, and an outer electrode;
   forming a laterally contacting pair of a semiconductor fin and a conductive strap structure, wherein the conductive strap structure vertically contacts the inner electrode of the deep trench capacitor;
   forming a gate stack overlying a body region of the semiconductor fin;
   forming source/drain regions in portion of the semiconductor fin located on opposite sides of the gate stack, the source/drain regions laterally surrounding the body region of the semiconductor fin;
   forming fully alloyed source/drain regions and an alloyed conductive strap structure; and
   forming a segregated interfacial dopant layer at an interface between each of the fully alloyed source/drain regions and the body region, wherein the alloyed conductive strap structure, the fully alloyed source/drain regions, the segregated interfacial dopant layer and the body region of the semiconductor fin have topmost surfaces that are coplanar with each other.

2. The method of claim 1, wherein the forming the fully alloyed source/drain regions and the alloyed conductive strap structure comprises:
   forming a metal layer over the gate stack, the source/drain regions, the conductive strap structure, and the substrate;
   performing an anneal to cause the metal layer to react with the source/drain regions and the conductive strap structures, wherein the anneal consumes an entirety of each of the source/drain regions; and
   removing an unreacted portion of the metal layer.

3. The method of claim 2, wherein the conductive strap structure comprises a base portion vertically contacting the inner electrode of the deep trench capacitor and a fin portion extending from the base portion and laterally contacting the semiconductor fin, the anneal consuming an entirety of the fin portion of the conductive strap structure and at least a portion of the base portion of the conductive strap structure.

4. The method of claim 2, wherein the metal layer comprises Ni, Co, Pt, W, Ti, Ta, Er, Yt, La, an alloy thereof, or any combination thereof.

5. The method of claim 1, wherein the forming the segregated interfacial dopant layer comprises:
   implanting dopants into the fully alloyed source/drain regions and the alloyed conductive strap structure; and
   performing a second anneal to drive the implanted dopants in the fully alloyed source/drain regions to the interface between each of the fully alloyed source/drain regions and the body region.

6. The method of claim 5, wherein the second anneal is a low temperature rapid thermal anneal performed at a temperature less than 700° C.

7. The method of claim 5, wherein the second anneal is a laser anneal.

8. The method of claim 1, wherein the source/drain regions are formed by ion implantation of dopants into portion of the semiconductor fin located on the opposite sides of the gate stack.

9. The method of claim 1, further comprising forming a first gate spacer on each sidewall of the gate stack prior to the forming the source/drain regions.

10. The method of claim 9, further comprising forming a second gate spacer on the first gate spacer prior to the forming the fully alloyed source/drain regions and the alloyed conductive strap structure.

11. The method of claim 1, wherein the forming the laterally contacting pair of a semiconductor fin and a conductive strap structure comprises:
    forming a conductive material cap over the deep trench capacitor, the conductive material cap having a top surface coplanar with a top surface of a top semiconductor layer located over the substrate;
    forming a fin-defining mask structure over the top semiconductor layer and the conductive material cap;
    removing portions of the top semiconductor layer and the conductive material cap using the fin-defining mask structure as an etch mask to provide a semiconductor layer portion and a conductive strap structure laterally contacting the semiconductor layer portion; and
    removing unwanted portions of the semiconductor layer portion to provide the semiconductor fin laterally contacting the conductive strap structure.

12. The method of claim 1, wherein the forming the deep trench capacitor in the substrate comprises:
    providing a semiconductor-on-insulator (SOI) substrate, the SOI substrate comprising a handle substrate, a buried insulator layer overlying the handle substrate, and a top semiconductor layer overlying the buried insulator layer;
    forming a deep trench in the SOI substrate, the deep trench extending through the top semiconductor layer and the buried insulator layer and into the handle substrate; and
    forming an outer electrode in portions of the handle substrate surrounding the deep trench;
    forming a node dielectric layer on sidewalls and a bottom surface of the deep trench;
    forming an inner electrode layer on the node dielectric layer, wherein the inner electrode layer fills the deep trench completely; and
    recessing the inner electrode layer and the node dielectric layer such that recessed surfaces of the inner electrode layer and the node dielectric layer are located between a top surface of the buried insulator layer and a bottom surface of the buried insulator layer.

13. The method of claim 1, wherein an entirety of each of the fully alloyed source/drain regions is alloyed with a metal.

14. The method of claim 1, wherein the alloyed conductive strap structure laterally contacts one of the fully alloyed source/drain regions.

15. The method of claim 1, wherein the gate stack comprises a gate dielectric, a gate electrode, and a gate cap.

16. The method of claim 1, wherein the segregated interfacial dopant layer has a greater dopant concentration than a dopant concentration of each of the fully alloyed source/drain regions.

17. The method of claim 1, wherein each of the fully alloyed source/drain regions and the alloyed conductive strap structure comprises a metal silicide or a metal germicide.

18. The method of claim 1, wherein the substrate comprises a handle substrate and a buried insulator layer located on the handle substrate, wherein the topmost surface of the deep trench capacitor is located between a top surface of the buried insulator layer and a bottom surface of the buried insulator layer.

19. The method of claim 18, wherein a p-n junction is formed between the outer electrode of the deep trench capacitor and the handle substrate.

\* \* \* \* \*